United States Patent
Gururaja Rao et al.

(10) Patent No.: US 11,519,613 B2
(45) Date of Patent: Dec. 6, 2022

(54) INDICATOR GENERATING METHOD AND PREDICTIVE MAINTENANCE METHOD FOR FAILURE PREDICTION FOR A WATER HEATING SYSTEM, SUCH WATER HEATING SYSTEM, AND BEVERAGE MAKER

(71) Applicant: Airbus Operations GmbH, Hamburg (DE)

(72) Inventors: Harsha Gururaja Rao, Hamburg (DE); Ajith Shenoy, Hamburg (DE); Thorsten Pannenbäcker, Hamburg (DE); Arzu Dreier, Hamburg (DE); Pablo Rodríguez Perulero, Hamburg (DE); Partha Adhikari, Hamburg (DE); Manish Patwari, Hamburg (DE)

(73) Assignee: AIRBUS OPERATIONS GMBH, Hamburg (DE)

( * ) Notice: Subject to any disclaimer, the term of this patent is extended or adjusted under 35 U.S.C. 154(b) by 120 days.

(21) Appl. No.: 17/034,275

(22) Filed: Sep. 28, 2020

(65) Prior Publication Data
US 2021/0095867 A1   Apr. 1, 2021

(30) Foreign Application Priority Data
Sep. 30, 2019   (IN) .............................. 201911039534

(51) Int. Cl.
*G06F 11/30*   (2006.01)
*F24D 19/10*   (2006.01)
(Continued)

(52) U.S. Cl.
CPC ......... *F24D 19/1063* (2013.01); *G01K 13/00* (2013.01); *G01M 99/005* (2013.01); *G01R 21/00* (2013.01); *G01F 1/00* (2013.01)

(58) Field of Classification Search
CPC ................................................... F24D 19/1063
See application file for complete search history.

(56) References Cited

U.S. PATENT DOCUMENTS

2010/0193593 A1* 8/2010 Hotton ............... G03G 15/5037
236/46 A
2011/0095010 A1   4/2011 Bondarowicz et al.
(Continued)

FOREIGN PATENT DOCUMENTS

FR      2995982 A1       3/2014
JP      2007-132599  *   5/2007
(Continued)

OTHER PUBLICATIONS

European Search Report for corresponding European Patent Application No. 1921027 dated May 5, 2020.

*Primary Examiner* — Phuong Huynh
(74) *Attorney, Agent, or Firm* — Greer, Burns & Crain, Ltd.

(57) ABSTRACT

An indicator generating method for generating an indicator which is suitable for maintenance prediction of a water heating system is proposed. A power state indication device generates a high power consumption signal if a heating device of the water heating system is activated. The time duration of the activation is such an indicator, if no water flow is present. Furthermore, the time interval between subsequent activations is such an indicator. A predictive maintenance method processes these condition-based indicators and determines a remaining useful lifetime according to a predictive maintenance model. The predictive maintenance device outputs a maintenance signal indicating required maintenance, if the remaining useful lifetime drops below a predetermined threshold. The methods may be performed by water heating systems or beverage makers.

15 Claims, 3 Drawing Sheets

(51) Int. Cl.
  *G01K 13/00*   (2021.01)
  *G01M 99/00*   (2011.01)
  *G01R 21/00*   (2006.01)
  *G01F 1/00*    (2022.01)

(56) References Cited

U.S. PATENT DOCUMENTS

2015/0028670 A1\* 1/2015 Boodaghians ......... B64D 11/04
                                                    307/9.1
2016/0178221 A1\* 6/2016 Thornton .............. F24H 9/2021
                                                    700/295

FOREIGN PATENT DOCUMENTS

| JP | 2007132599 A | 5/2007 |
| JP | 2012255568 A | 12/2012 |

\* cited by examiner

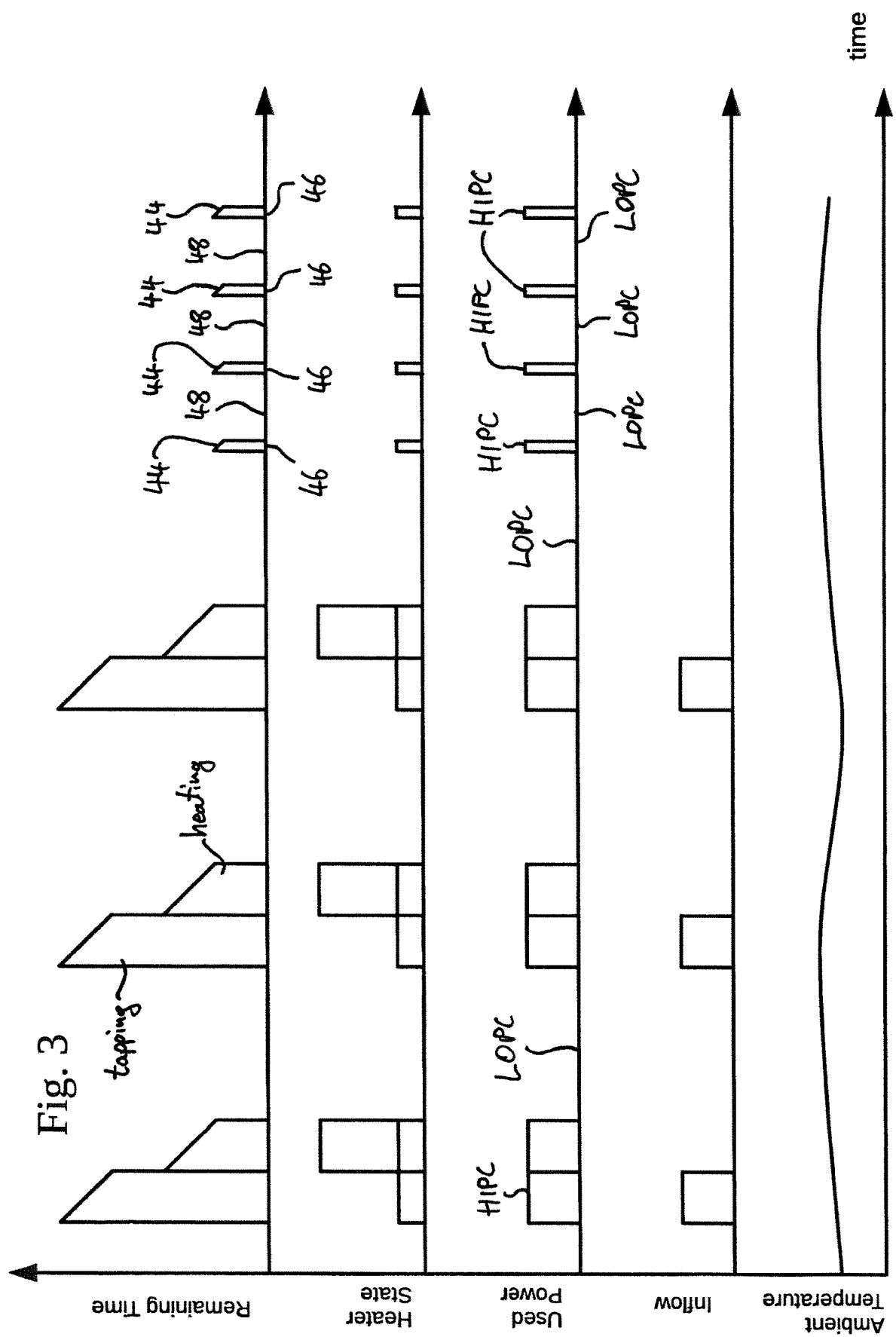

INDICATOR GENERATING METHOD AND PREDICTIVE MAINTENANCE METHOD FOR FAILURE PREDICTION FOR A WATER HEATING SYSTEM, SUCH WATER HEATING SYSTEM, AND BEVERAGE MAKER

CROSS-REFERENCES TO RELATED APPLICATIONS

This application claims the benefit of the Indian patent application No. 201911039534 filed on Sep. 30, 2019, the entire disclosures of which are incorporated herein by way of reference.

FIELD OF THE INVENTION

The invention relates to a method and device for generating an indicator which is suitable for maintenance prediction of a water heating system. Furthermore the invention relates to a water heating system e.g., beverage maker.

BACKGROUND OF THE INVENTION

US 2011/0 095 010 A1 discloses a water heating system with a resistive heating element. A control is connected for monitoring a resistance parameter of the resistive heating element, wherein the control is configured to output a fault signal if the monitored resistance parameter exceeds a set threshold.

SUMMARY OF THE INVENTION

It is an object of the invention to improve water heating systems with respect to maintenance.

The invention provides an indicator generating method for generating an indicator which is suitable for maintenance prediction of a water heating system, the water heating system comprising a water tank containing water to be heated by a heating device, a power state indication device and a monitoring device, the method comprising:

the power state indication device generating at least a low power consumption signal or a high power consumption signal based on the power consumption of the heating device;

the monitoring device determining a condition-based degradation indicator based on the time duration of the high power consumption signal which may be included in some water heating system state information;

wherein the monitoring device outputs the condition-based degradation indicator for further processing in a predictive maintenance device.

Preferably, the power state indication device includes a power measurement device which measures the power consumption of the heating device and generates the high power consumption signal, if the power consumption exceeds a predetermined high power threshold, and/or generates the low power consumption signal, if the power consumption drops below a predetermined low power threshold.

Preferably, the high power threshold and the low power threshold are set to be equal.

Preferably, the power state indicator device includes a communication interface which outputs the current water heating system state to an inter-device communications network, from which the monitoring device is able to obtain the water heating system state.

Preferably, the monitoring device determines a reheating time, which is the time duration of the high power consumption signal, and outputs the reheating time as a condition-based degradation indicator.

Preferably, the time duration is determined by certain states of the water heating system.

Preferably, the monitoring device determines a condition-based degradation indicator also based on the time interval between two subsequent high power consumption signals.

Preferably, the monitoring device determines the presence of a reheating cycle at least based on the time interval between two subsequent high power consumption signals.

Preferably, the monitoring device determines a reheating frequency, which is the time interval between two subsequent high power consumption signals, and additionally outputs reheating frequency as a condition-based degradation indicator.

Preferably, the water heating system comprises one or more additional sensors, which measure additional physical quantities, and the monitoring device additionally processes the measured quantities for generating the indicator.

Preferably, the water heating system comprises an ambient temperature sensor, which measures the ambient temperature, and the monitoring device additionally processes the measured ambient temperature for generating the indicator.

Preferably, the water heating system comprises a water quality sensor for obtaining a water quality, the water quality sensor being configured for measuring physical parameters indicative of the specific heat capacity, and the monitoring device additionally processes the obtained water quality for generating the indicator.

Preferably the water quality sensor is configured for measuring total dissolved solids in water.

Preferably, the monitoring device determines a usage-based indicator based on sensor data and/or state information available on an inter-device communications network.

Preferably, the usage-based indicator includes the number of operation cycles, heating times, water quality, and/or water flows.

Preferably, the water heating system comprises a water flow sensor, which measures the presence of water flow to or from the tank, and the monitoring device discards the high power consumption signal input, preferably as a reheating cycle, if the water flow sensor detects presence of a water flow, and/or the monitoring device additionally outputs the water flow sensor data as a usage-based indicator.

Preferably, the water heating system comprises a water quality sensor, which measures the quality of the water and the monitoring device corrects the reheating times and/or reheating frequency based on the specific heat capacity, and/or the monitoring device additionally outputs the water quality sensor data as a usage-based indicator.

Preferably, the water quality sensor comprises a total dissolved solids sensors (TDS sensor).

The invention provides a predictive maintenance method for generating a maintenance signal, which indicates that a water heating system monitored by a predictive maintenance device requires maintenance, the water heating system comprising a water tank containing water to be heated by a heating device, a power state indication device and a monitoring device, the method comprising:

performing a preferred indicator generating method, so as to generate at least a condition-based degradation indicator;

the predictive maintenance device determining a remaining useful lifetime based on the indicator from the previous step;

the predictive maintenance device outputting the maintenance signal, if the remaining useful lifetime or the condition based indicator or the usage based indicator drops below a predetermined threshold.

Preferably, the condition-based degradation indicator includes a reheating time, and the predictive maintenance device determines the remaining useful lifetime such that the remaining useful lifetime decreases, if the reheating time increases.

Preferably, the condition-based degradation indicator includes a reheating frequency, and the predictive maintenance device determines the remaining useful lifetime such that the remaining useful lifetime decreases, if the reheating frequency increases.

Preferably, wherein the condition-based degradation indicator includes an ambient temperature and/or water quality, and the predictive maintenance device determines the remaining useful lifetime such that the remaining useful lifetime decreases, if the predictive maintenance device determines that the reheating time is larger than and/or the reheating frequency is higher than an expected value for the reheating time and/or reheating frequency, wherein preferably the expected value is determined based on the ambient temperature and/or water quality.

The invention provides a water heating system for a beverage maker of an aircraft galley, the water heating system configured for heating water and comprising a water tank suitable to hold water to be heated, a heating device configured for heating the water within the water tank, a power state indication device configured for generating at least a low power consumption signal or a high power consumption signal based on the power consumption of the heating device; and a monitoring device configured for performing a preferred indicator generating method or a preferred predictive maintenance method.

The invention provides a beverage maker, in particular coffee maker or tea maker, for an aircraft galley comprising a preferred water heating system.

The invention provides a data medium containing instructions for a computer system, which, when executed by the computer system, perform a preferred method according to the invention.

The idea is in the field of predictive maintenance for heated water tank equipment, especially beverage makers in aircraft galleys.

With the invention certain failures of such equipment may be detected:

condition-based degradation of the heating system including heater degradation and limescale condition-based degradation of heat loss including tank insulation degradation or leakage of hot water usage-based information that might be correlated to equipment failures Furthermore, the invention may allow for improved (i.e., minimized) observability requirements and technical solution for their implementation.

Results of the measures may be offered as a digital service in a predictive maintenance framework and/or for maintenance services of flight hour services in order to allow prediction improved spares ability.

An approach to observe a heating system degradation of a water tank includes measuring input tank temperatures, water flow, and electrical power. However, the invention is based on the idea that these observability requirements may be reduced to a few features that can be approximately derived from a single sensor, e.g., a power sensor.

In contrast to the known methods and devices, the invention may avoid the installation of additional sensors, take into account available data from modern aircraft communication protocols such as ARINC 812, and allow application to aircraft already in service.

The focus here are beverage makers for aircraft galleys. It should be noted that the invention may be applicable to other devices having water heating systems with a closed tank that is kept at a certain temperature.

From a customer's point of view, the beverage makers in aircraft are among the top most devices for which predictive maintenance is requested. Economically, the costs of operational interruption due to untimely maintenance of this equipment and removal amount to a significant potential for improvement.

The invention may derive degradation patterns from evaluation of a minimum set of measured data.

A minimized set of features is used for predictive maintenance of, e.g., beverage makers. This preferably includes condition-based indicators describing the actual condition of the equipment and/or usage-based indicators which may be correlated with equipment condition. These indicators may be derived from existing data for smart devices and/or a single sensor for legacy devices.

One possibility is the so called "reheating time". The "reheating time" feature describes the time duration it regularly takes to keep the water in the equipment tank within a temperature range. The temperature range can be predetermined by an upper and a lower threshold without in- and outflow of water (i.e., no mixing problem). This features usually shows an increasing trend covering degradations typically caused by limescale, heater degradation, thermostat degradation, etc.

The basic relation for the heating process is $$Q = c \cdot m \Delta T$$

with Q being the heat quantity, c being the specific heat capacity, m being the mass to be heated, and $\Delta T$ being the temperature delta to be heated, i.e., the difference between upper and lower temperature threshold.

The heat quantity can be split into its components $$Q = Q_{in} - Q_{out} = Q_{heater} - (Q_{flow} + Q_{dissipation})$$

where $$Q_{heater} = P_{heater} \cdot t = P_{heater\_nominal} \eta_{heater} \cdot t$$

with $P_{heater\_nominal}$ being the heater nominal power, $\eta_{heater}$ being the heating efficiency, and t being time.

Within the context of the invention, heating efficiency is assumed to be a good indicator for the heating system degradation. Isolating the heating efficiency gives the following relation:

$$\eta_{heater} = \frac{c \cdot m \cdot \Delta T + (Q_{flow} + Q_{dissipation})}{P_{heater\_nominal} \cdot t}$$

According to the invention, the following applies to beverage makers:

c is the specific heat capacity and is approximately constant for all water qualities;

$P_{heater\_nominal}$ is the nominal electrical power of the heating element and is considered constant.

Furthermore, during a reheating cycle also the following applies:

ΔT is the temperature delta and is considered constant for each reheating cycle, as a water tank will switch on the heater at a lower threshold and switch off the heater when the set point is reached;

m is the water mass to be heated and is considered constant as no water flow is present and the steady state filling level is considered approximately constant;

$Q_{flow}$ is the heat loss due to outflowing hot water and is set 0 during the reheating cycle;

$Q_{dissipation}$ is the heat loss of the tank by dissipation and is considered to be much smaller than $Q_{heater}$ and is therefore set to 0 during the reheating cycle.

Thus for the reheating cycle the following holds:

$$\eta_{heater} = \frac{c \cdot m \cdot \Delta T + (Q_{flow} + Q_{dissipation})}{P_{heater\_nominal} \cdot t} = \frac{c \cdot m \cdot \Delta T}{P_{heater\_nominal}} \cdot \frac{1}{t_{reheatintg}}$$

where the first term is considered constant:

$$\eta_{heater} = C_{heated\_tank} \cdot \frac{1}{t_{reheating}}$$

wherein $C_{heated\_tank}$ is an equipment specific constant.

Consequently, the invention allows to observe a degrading heat efficiency if a relative increase in time for which the heater is turned on during reheating cycles is measured. Thus the "reheating time" is measured. Another condition-based indicator is the reheating frequency. The reheating frequency describes the time between two consecutive reheating cycles and is determined by the heat loss from the temperature set point to the lower threshold when the next reheating cycle starts.

This heat loss is nominally caused by the temperature drop between the hot water within the tank and the lower ambient temperature and covers failure cases like a degrading tank insulation or hot water leakage.

As the ambient temperature is usually not constant, a measurement of this value is preferred to easily distinguish between nominal heat loss and heat loss due to degradation.

Usage-based indicators may be correlated to other failure types. Usage-based indicators include operating cycles, heating times and water flows to be cumulated.

The method according to the invention requires at least the duration of the reheating time as input. For the implementation of this input, two main categories of beverage maker are distinguished: legacy equipment without a communication interface and "smart" equipment implementing, e.g., the ARINC 812 standard.

Smart beverage makers may be ARINC 812 enabled, for example. The ARINC 812 standard defines a State_message whereby e.g., a beverage maker can communicate their state, and especially requests to a power management function for a certain power budget for a certain time. This time is decremented every second from a certain starting value in a Remaining_Time field.

In this case, it is easily possible to extract the "reheating time" input. The reheating cycles can be identified by any of their regular occurrence, the relatively short power request duration (such as 60 seconds), and the relatively short actual heating duration (about 10 seconds). Further parameters will ease and improve the feature extraction. Thus, those embodiments are preferred. They may include water flow values, ambient temperature, and water quality.

They could be included in future equipment modifications or implemented as external sensors upstream of the equipment. The invention for this part thus may include technical means for feature extraction based on ARINC 812 data, especially power request budgets and timers.

Legacy beverage makers, i.e., older beverage maker types, do not include a communication interface. In order to obtain the same features, a power measurement can be implemented upstream of the input of the beverage maker. This measurement does merely need to distinguish between normal (e.g., stand-by) and increased power consumption (heating) and their respective durations.

It is not required—though possible and preferred—to measure further characteristics of the electrical flow like exact values, its spectrum, etc.

Implementation options are, for example:

circuit breakers, e.g., on SSPC basis supplying power to the equipment could measure the required data; and/or non-intrusive power measurement clamps could measure the required data on the equipment's power supply line.

Further parameters may ease and improve the feature extraction. They include water flow values, ambient temperature, and/or water quality. They can be installed as external sensors upstream of the equipment comparable to the power measurement.

The invention thus includes technical means for feature extraction comprising of one or more retrofittable sensors, in particular upstream of the equipment without requiring an equipment modification.

As with this embodiment no timer values but only the power profile is available, a distinction between "reheating time" and other types of heating (e.g., during or following a water outflow and subsequent inflow of colder water) requires a bit more effort.

The basic principles for feature extraction is based on the availability of data such as "used power", e.g., the duration of high power inflows. Additional data, e.g., the "remaining time" field in the ARINC 812 data or a flow sensor value can make the feature extraction more precise.

BRIEF DESCRIPTION OF THE DRAWINGS

Embodiments of the invention are described in more detail with reference to the accompanying schematic drawings. Therein:

FIG. 3 is a diagram of different indicators.

DETAILED DESCRIPTION OF THE PREFERRED EMBODIMENTS

Figure 1:
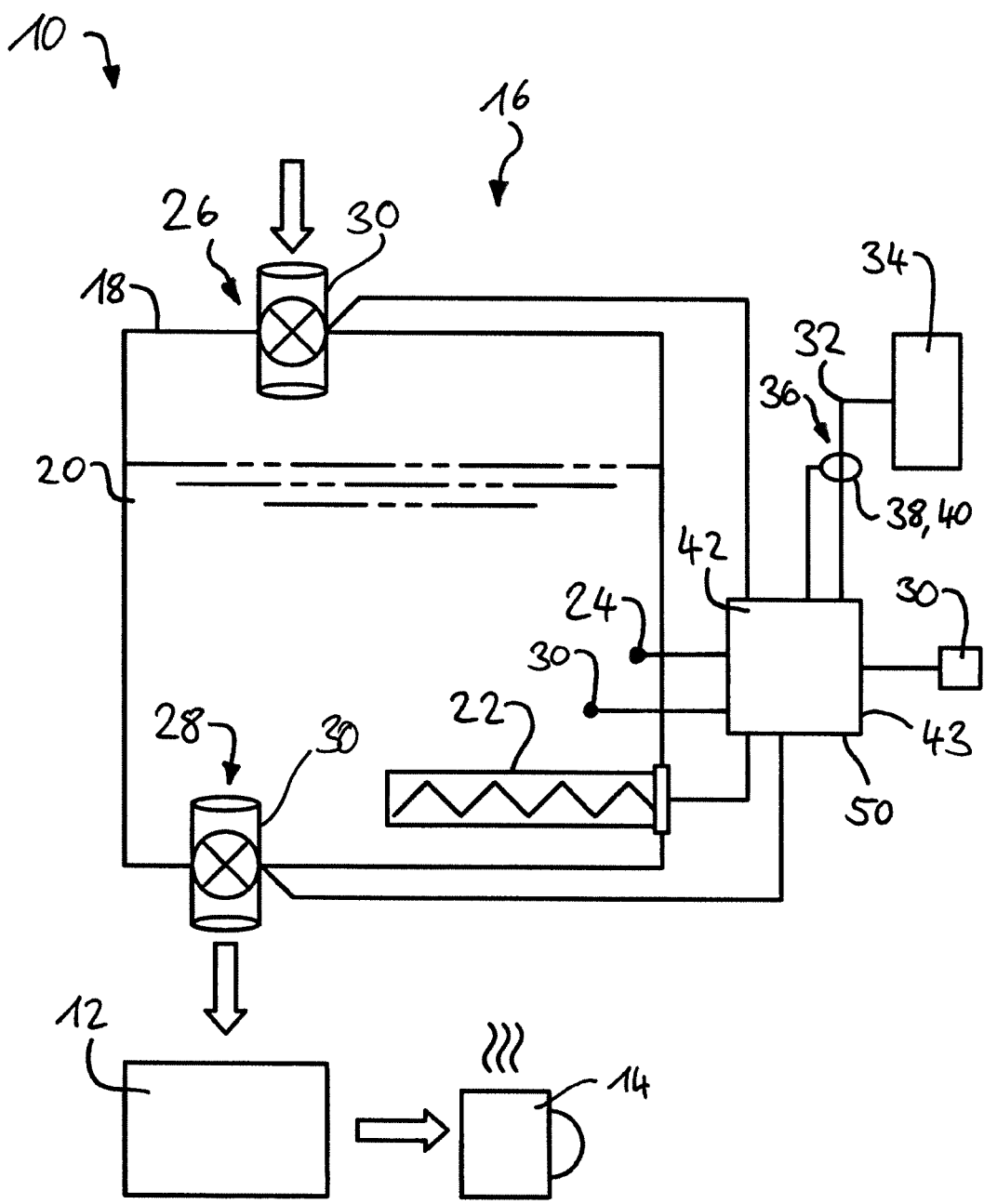
FIG. 1 depicts an embodiment of a beverage maker according to the invention.

Referring to FIGS. 1 and 3, a beverage maker 10 is depicted. The beverage maker 10 is configured for a galley of an aircraft. The beverage maker 10 comprises a brewing assembly 12 for preparing hot beverages 14 from hot water. The brewing assembly 12 may be configured for preparing coffee or tea, for example.

Furthermore, the beverage maker 10 includes a water heating system 16 which is configured for heating water. Preferably, the water heating system 16 is configured to keep the heated water within a predetermined temperature range.

The water heating system 16 comprises a water tank 18 which is able to hold water 20 to be heated. The water tank 18 may have a thermal insulation so as to reduce heat dissipation from the water tank 18 to the environment.

The water heating system 16 comprises a heating device 22. The heating device 22 is arranged within the water tank 18 so as to be able to heat the water 20.

The water heating system 16 comprises a thermal sensor 24 for measuring the temperature of the water 20. The thermal sensor 24 can be integrated into the heating device 22. It is also possible that the thermal sensor 24 is configured separately or integrated in another suitable component of the water heating system 16.

The water heating system 16 includes an inlet valve 26 which controls the inlet of fresh water into the water tank 18. Furthermore, the water heating system 16 includes an outlet valve 28 which controls the outlet of hot water to the brewing assembly 12.

The water heating system 16 comprises one or more additional sensors 30. The additional sensor 30 may be select from a group containing ambient temperature sensors, water flow sensors, and water quality sensors.

The water quality sensors may be configured for obtaining a water quality, by measuring physical parameters of the water 20, the physical parameters being indicative of the specific heat capacity of the water 20. As an example, the water quality sensor may be a TDS Sensor which measures the amount of total dissolved solids in the water 20.

Two additional sensors 30 may be water flow sensors arranged close to or integrated in the inlet valve 26 and outlet valve 28, so as to be able to measure inflow and/or outflow.

The water heating system 16 comprises a power supply line 32 with which the water heating system 16 is connected to a power supply 34. The power supply 34 is preferably provided by an aircraft on board power grid, for example.

The water heating system 16 also includes a power state indication device 36, which is configured to generate a low power consumption signal LOPC and a high power consumption signal HIPC based on the power consumed by the water heating system 16, in particular, the heating device 22.

The power state indication device 36 comprises a power measurement device 38, such as a power clamp 40 which is suitable for measuring power consumption without direct electrical contact to the power supply line 32.

Thus, the low power consumption signal LOPC indicates that the heating device 22 is off, while the high power consumption signal HIPC indicates that the heating device 22 is active and heating the water 20.

The water heating system 16 comprises a monitoring device 42. The monitoring device 42 is configured to monitor the water heating system 16. The monitoring device 42 may be implemented as a computer or microcontroller of some sort and perform various methods described below.

Furthermore, the monitoring device 42 is connected to the power measurement device 38.

The monitoring device 42 may be configured as a separate module.

Furthermore, the monitoring device 42 need not be integrated into the beverage maker 10 or the water heating system 16. It is also possible for the monitoring device 42 to be arranged at a different location within the aircraft. The monitoring device 42 may be part of the power state indication device 36.

The water heating system 16 comprises a control device or controller 43. The control device 43 is configured to control the water heating system 16 and possibly the beverage maker 10. The control device 43 is connected to the heating device 22 so as to switch the heating device 22 on and off to keep the water 20 within a known temperature range.

The control device 43 is also connected to the inlet and outlet valves 26, 28 as well as the additional sensors 30.

The monitoring device 42 and the control device 43 are presently described as being integrated into a single unit. It should be noted that the devices may be separate and not even within the vicinity of each other.

At the beginning of operation of the water heating system 16 or the beverage maker 10, the control device 43 fills the water tank 18 via inlet valve 26 if necessary and activates the heating device 22 so as to heat the water 20.

After this initial heating, the control device 43 measures the water temperature of the water 20 using thermal sensor 24. If the water temperature drops below a lower threshold, the heating device 22 is activated until the water temperature exceeds an upper threshold. Thus, the water temperature is kept within a predetermined temperature range. The process between two such subsequent activations of the heating device 22 is called a reheating cycle 44.

The time duration for which the heating device 22 is activated, i.e., the high power consumption signal HIPC is active, is the reheating time 46. The reheating time 46 is determined by the monitoring device 42 by storing a first timestamp, when the power state indication device 36 changes from the low power consumption signal LOPC to the high power consumption signal HIPC, and a second time stamp, when the power state indication device 36 changes from the high power consumption signal HIPC to the low power consumption signal LOPC. The reheating time 46 is then determined by subtracting the first timestamp from the second time stamp. As an alternative, a timer may be used to measure the relevant time intervals instead of the timestamps.

The reheating time 46 is stored as a condition-based degradation indicator for further processing. Alternatively or additionally, the reheating time 46 may be processed further directly.

In addition, the monitoring device 42 may also determine the time interval between two subsequent reheating cycles 44. This time interval is called reheating frequency 48.

The reheating frequency 48 is also stored as a condition-based degradation indicator for further processing. Alternatively or additionally, the reheating frequency 48 may be processed further directly.

The following pseudo code outlines the principles of the determination in case that only a power based signal, e.g., in case of minimum instrumentation of legacy beverage makers, such as beverage maker 10, is available.

This method is an approximation as the distinction between operating cycles and subsequent heating is not easily possible, unless, e.g., with additional water flow data, which can be acquired from a sensor integrated in the outlet valve 28, for example.

```
// condition-based indicators
list<time, float> reheating_times
list<time, float> reheating_frequency
// usage-based indicators
list<time, int> brew_cycles
list<time, int> tapping_cycles
list<time, float> heating_time
list<time, float> water_flow
// constants to be defined per equipment model
REHEATING_THRESHOLD
```

-continued

```
BREW_CYCLE_TIME
BREW_CYCLE_FLOW
TAPPING_FLOW
// feature extraction method for power
for each timestep i
// identify start of HIGH power consumption
if (POWER_STATE(i-1) == LOW && POWER_STATE(i) == HIGH)
start_time = current_time(i)
//identify time between two consecutive reheating cycles
if (last_cycle_type == 'REHEATING')
add reheating_frequency(start_time, (start_time-stop_time))
// identify end of HIGH power consumption
if (POWER_STATE(i-1) == HIGH && POWER_STATE(i) == LOW)
stop_time = current_time(i)
// identify duration of heating cycle
cycle_time = stop_time - start_time
add heating_time(start_time, cycle_time)
// identify reheating cycles
if (cycle_time < REHEATING_THRESHOLD)
last_cycle_type = 'REHEATING'
add reheating_times(start_time, cycle_time)
// identify brew cycles (incl. subsequent heating) else if (cycle_time >
    BREW_CYCLE_TIME)
last_cycle_type = 'BREW'
add brew_cycles(start_time, 1)
add water_flow(start_time, BREW_CYCLE_FLOW)
// identify tapping cycles (incl. subsequent heating)
else if (cycle_time <BREW_CYCLE_TIME)
last_cycle_type = 'TAPPING'
add tapping_cycles(start_time, 1)
add water_flow (start_time, TAPPING_FLOW * cycle_time)
```

The water heating system 16 may also comprise a predictive maintenance device 50. The predictive maintenance device 50 may be formed as a single unit or by plurality of components. Furthermore, the predictive maintenance device 50 may be part of the beverage maker 10 or water heating system 16 or an external component.

The predictive maintenance device 50 is configured to output a maintenance signal, which indicates that the water heating system 16 requires maintenance. The predictive maintenance device 50 may be integral with the monitoring device 42 or a separate device.

Based on the condition-based degradation indicator and, if available usage-based indicators, the predictive maintenance device 50 determines an estimate remaining useful lifetime using a predictive maintenance model.

The maintenance signal is output, if the remaining useful lifetime or the condition based indicator or the usage based indicator drops below a predetermined threshold. For example, the maintenance signal is output, if an increasing reheating time causes the remaining useful lifetime to drop below a number of hours that are smaller than the next flight segment. Furthermore, the maintenance signal may be output, if the reheating frequency drops below a predetermined reheating frequency threshold.

It should be noted that the maintenance signal may also be configured to have different levels of urgency, e.g., "good for one more flight segment" and/or "out of order/maintenance required".

The maintenance signal may also include information about the type of expected fault, such as issues with the heating element 22 or insulation of the water tank 18 or possible leakage. The predictive maintenance device 50 may hence include a predictive maintenance model of the beverage maker 10 or the water heating system 16.

Figure 2:
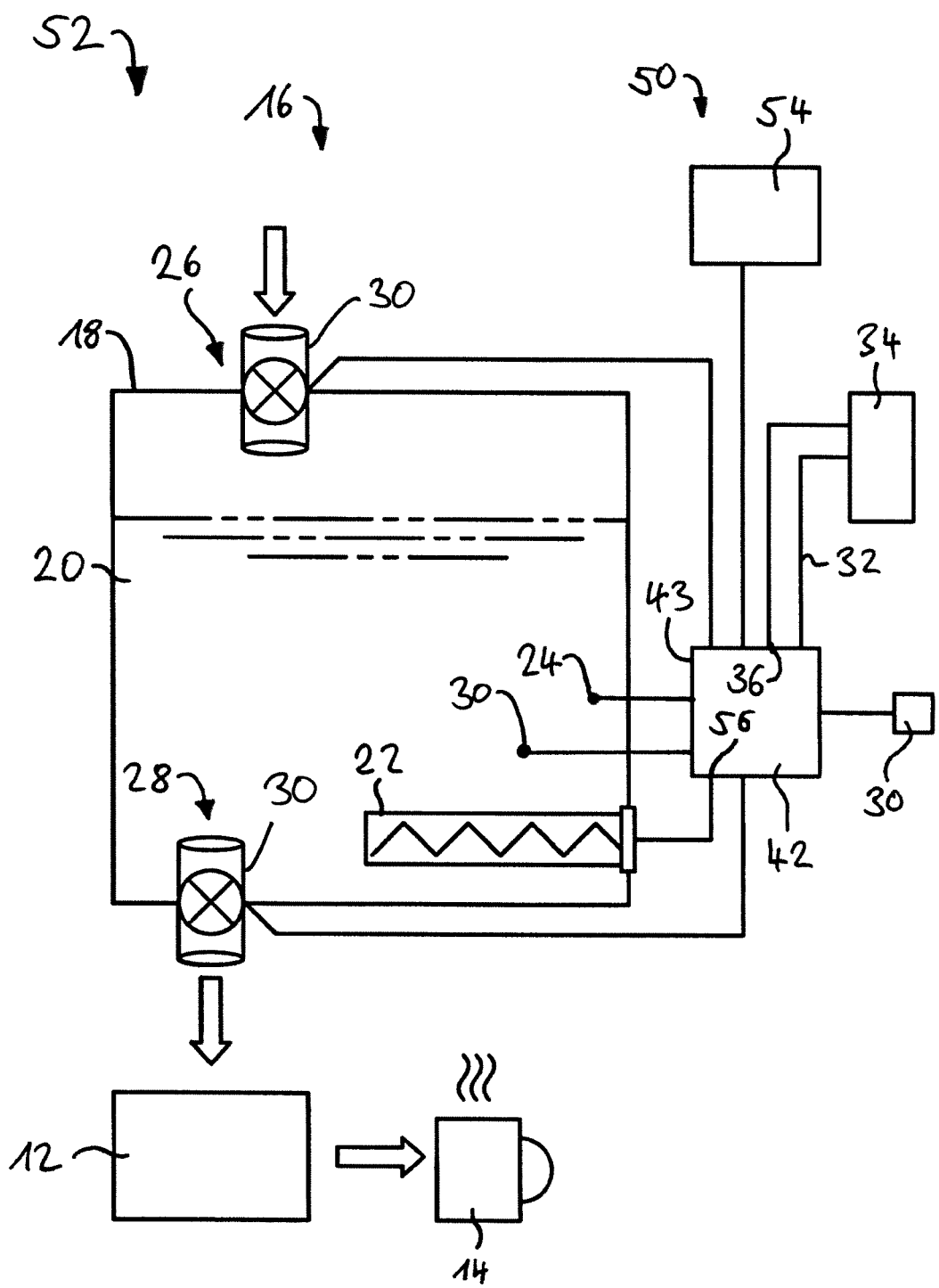
FIG. 2 depicts another embodiment of a beverage maker according to the invention.

FIG. 2 depicts another embodiment of a beverage maker 52 which is adapted for a modern inter-device communications network that is governed by a protocol such as ARINC 812. The beverage maker 52 therefore comprises a communication interface 54. The communication interface 54 is configured to process all kinds of state-related data communicated by the inter-device communications network.

The beverage maker 52, more precisely the power state indication device 36, comprises a heater state communication interface 56. The heater state communication interface 56 outputs the state of the heating device 22 via the inter-device network. Thus no additional power measurement is necessary. Rather the heater state communication interface 56 is giving the current state (on or off) of the heating device 22.

Then as described above, the monitoring device 42 may, e.g., store timestamps (and/or time intervals) accordingly in order to determine the reheating time and/or reheating frequency.

Further useful data, such as the tap flow, etc., may be obtained via the communication interface 54, if available.

The following pseudo code outlines the determination of condition-based degradation indicators if ARINC 812 data is available. This feature extraction method is improved compared to the power approach but may also include approximations, e.g., in case of aborted catering cycles which could be reduced by taking into account further ARINC 812 values or, e.g., with additional water flow data.

```
// condition-based indicators
list<time, float> reheating_times
list<time, float> reheating_frequency
// usage-based indicators
list<time, int> brew_cycles
list<time, int> tapping_cycles
list<time, float> heating_time
list<time, float> water_flow
// constants to be defined per equipment model
MINIMUM_TIME_VALUE_FOR_PBR
CATERING_TIME_VALUE_FOR_PBR
REHEATING_THRESHOLD
BREW_CYCLE_TIME
BREW_CYCLE_FLOW
TAPPING_FLOW
// feature extraction algorithm for ARINC 812
for each timestep i
// identify start of heating cycle
if(HEATER_STATE (i-1) == 'STANDBY_ON' && HEATER_STATE (i)
    == 'ON')
start_time = current_time(i)
timer_for_pbr = current_timer_value(i)
//identify time between two consecutive reheating cycles
if (last_cycle_type == 'REHEATING')
```

-continued

```
add reheating_frequency(start_time, (start_time - stop_time))
// identify end of heating cycle
if (HEATER_STATE (i-1) == 'ON' && HEATER_STATE (i) ==
    'FINISHED')
stop_time = current_time(i)
// identify duration of heating cycle
cycle_time = stop_time - start_time
add heating_time(start_time, cycle_time)
// identify reheating cycles
if (timer_for_pbr == MINIMUM_TIME_VALUE_FOR_PBR &&
    cycle_time < REHEATING_THRESHOLD)
last_cycle_type = 'REHEATING'
add reheating_times(start_time, cycle_time)
// identify heating cycle following brew and/or tapping cycle
if (last_cycle_type == 'BREW' || last_cycle_type == 'TAPPING' ||
    last_cycle_type == 'BREW/TAPPING')
last_cycle_type = 'HEATING-UP'
// could be used to reverse calculate water inflow temperature etc.
// identify brew cycles (excl. subsequent heating)
else if (timer_for_pbr == CATERING_TIME_VALUE_FOR_PBR &&
    cycle_time ~= BREW_CYCLE_TIME)
last_cycle_type = 'BREW'
add brew_cycles(start_time, 1)
add water_flow(start_time, BREW_CYCLE_FLOW)
// identify tapping cycles (excl. subsequent heating) else if (timer_for_pbr
    == CATERING_TIME_VALUE_FOR_PBR && cycle_time <
    BREW_CYCLE_TIME)
last_cycle_type = 'TAPPING'
add tapping_cycles(start_time, 1)
add water_flow(start_time, TAPPING_FLOW * cycle_time)
// identify combined brew and tapping cycles (excl. subsequent heating)
else if (timer_for_pbr == CATERING_TIME_VALUE_FOR_PBR &&
    cycle_time > BREW_CYCLE_TIME)
last_cycle_type = 'BREW/TAPPING'
add brew_cycles(start_time, 1)
add tapping_cycles(start_time, 1)
add water_flow(start_time, BREW_CYCLE_FLOW + (TAPPING_FLOW
    * (cycle_time - BREW_CYCLE_TIME))
```

The features obtained by the above outlined methods can serve as an input for prediction modelling methods either individually or in combination, e.g., the reheating time and frequency. Also, a cleaning of the feature data could be done, e.g., for removal of outliers.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE SIGNS 10 beverage maker
12 brewing assembly
14 hot beverage
16 water heating system
18 water tank
20 water
22 heating device
24 thermal sensor
26 inlet valve
28 outlet valve
30 additional sensor
32 power supply line
34 power supply
36 power state indication device
38 power measurement device
40 power clamp
42 monitoring device
43 control device
44 reheating cycle
46 reheating time
48 reheating frequency
50 predictive maintenance device
52 beverage maker
54 communication interface
56 heater state communication interface

The invention claimed is:

1. An indicator generating method for generating an indicator which is suitable for maintenance prediction of a water heating system, the water heating system comprising a water tank containing water to be heated by a heating device, a power state indication device and a monitoring device, the method comprising:
  generating, via the power state indication device, at least a low power consumption signal or a high power consumption signal based on a power consumption of the heating device;
  determining, via the monitoring device, a condition-based degradation indicator based on a time duration of the high power consumption signal;

outputting, via the monitoring device, the condition-based degradation indicator for further processing in a predictive maintenance device,
wherein the monitoring device determines at least one of (1) a condition-based degradation indicator based on a time interval between two subsequent high power consumption signals and (2) a reheating frequency, which is a time interval between two subsequent high power consumption signals, and additionally outputs a reheating frequency as a condition-based degradation indicator.

2. The method according to claim 1, wherein the power state indication device includes a power measurement device which measures the power consumption caused by the heating device and generates at least one of:
the high power consumption signal, if the power consumption exceeds a predetermined high power threshold, or
the low power consumption signal, if the power consumption drops below a predetermined low power threshold.

3. The method according to claim 1, wherein the power state indicator device includes a communication interface which outputs a current water heating system state to an inter-device communications network, from which the monitoring device is able to obtain the current water heating system state and able to generate at least one of the low power consumption signal or high power consumption signal, depending on the obtained water heating system state.

4. The method according to claim 1, wherein the monitoring device determines a reheating time, which is a time duration of the high power consumption signal, and outputs the reheating time as a condition-based degradation indicator.

5. The method according to claim 1, wherein the water heating system comprises at least one additional sensor, wherein each additional sensor is configured for measuring at least one of an additional physical quantity and an ambient temperature, wherein the monitoring device additionally processes the measured quantity or temperature for generating the indicator.

6. The method according to claim 5, wherein the monitoring device determines a usage-based indicator based on at least one of sensor data or state information available on an inter-device communications network or the additional sensor.

7. The method according to claim 6, wherein the usage-based indicator includes at least one of a number of operation cycles, heating times, water quality, or water flows.

8. The method according to claim 1, wherein the water heating system comprises a water flow sensor which measures a presence of water flow to or from the tank, and the monitoring device at least one of:
discards high power consumption signals as reheating cycle, if the water flow sensor detects presence of a water flow,
additionally outputs water flow sensor data as a usage-based indicator.

9. A predictive maintenance method for generating a maintenance signal, which indicates that a water heating system monitored by a predictive maintenance device requires maintenance, the water heating system comprising a water tank containing water to be heated by a heating device, a power state indication device and a monitoring device, the method comprising:
performing an indicator generating method according to claim 1, so as to generate at least a condition-based degradation indicator;
determining, via the predictive maintenance device, a remaining useful lifetime based on the indicator from the previous step, by processing at least one of the condition- based degradation indicator or other indicators using a predictive maintenance model;
outputting, via the predictive maintenance device, the maintenance signal, if the remaining useful lifetime or the condition based indicator or the usage based indicator drops below a predetermined threshold.

10. The method according to claim 9, wherein at least one of:
the condition-based degradation indicator includes a reheating time, and the predictive maintenance device determines the remaining useful lifetime such that the remaining useful lifetime decreases, if the reheating time increases;
the condition-based degradation indicator includes a reheating frequency, and the predictive maintenance device determines the remaining useful lifetime such that the remaining useful lifetime decreases, if the reheating frequency decreases;
the condition-based degradation indicator includes at least one of an ambient temperature or water quality, and the predictive maintenance device determines the remaining useful lifetime such that the remaining useful lifetime decreases, if the predictive maintenance device determines that the reheating time is at least one of larger than, or the reheating frequency is smaller than, an expected value for at least one of the reheating time or reheating frequency, wherein the expected value is determined based on at least one of the ambient temperature or water quality.

11. A water heating system for a beverage maker of an aircraft galley, the water heating system configured for heating water and comprising:
a water tank suitable to hold water to be heated,
a heating device configured to heat the water within the water tank,
a power state indication device configured to generate at least a low power consumption signal or a high power consumption signal based on a power consumption of the heating device; and
a monitoring device configured to perform the indicator generating method according to claim 1.

12. A water heating system for a beverage maker of an aircraft galley, the water heating system configured for heating water and comprising:
a water tank suitable to hold water to be heated,
a heating device configured to heat the water within the water tank,
a power state indication device configured to generate at least a low power consumption signal or a high power consumption signal based on a power consumption of the heating device; and
a monitoring device configured to perform the predictive maintenance method according to claim 9.

13. A beverage maker for an aircraft galley comprising a water heating system according to claim 11.

14. A beverage maker for an aircraft galley comprising a water heating system according to claim 12.

15. A data medium containing instructions for a computer system, which, when executed by the computer system, performs the method according to claim 1.

* * * * *